United States Patent [19]

Tasaka

[11] Patent Number: 5,362,668
[45] Date of Patent: Nov. 8, 1994

[54] METHOD OF FABRICATING AN BPSG-FILLED TREND AND OXIDATION ISOLATION STRUCTURE WITH A GATE ELECTRODE

[75] Inventor: Kazuhiro Tasaka, Tokyo, Japan

[73] Assignee: NEC Corporation, Tokyo, Japan

[21] Appl. No.: 28,113

[22] Filed: Mar. 9, 1993

[30] Foreign Application Priority Data

Mar. 9, 1992 [JP] Japan .................. 4-050208

[51] Int. Cl.$^5$ ............... H01L 21/302; H01L 21/76
[52] U.S. Cl. ............................... 437/67; 437/228
[58] Field of Search ................... 437/67, 228, 63;
148/DIG. 50, DIG. 85, DIG. 86

[56] References Cited

U.S. PATENT DOCUMENTS

| | | | |
|---|---|---|---|
| 4,571,819 | 2/1986 | Rogers et al. | 29/576 |
| 4,740,480 | 4/1988 | Ooka | 437/61 |
| 5,217,920 | 6/1993 | Mattox et al. | 437/67 |
| 5,229,319 | 7/1993 | Nishio | 437/67 |
| 5,231,046 | 7/1993 | Tasaka | 437/67 |
| 5,275,965 | 1/1994 | Manning | 437/67 |

Primary Examiner—George Fourson
Assistant Examiner—David Mason
Attorney, Agent, or Firm—Sughrue, Mion, Zinn, Macpeak & Seas

[57] ABSTRACT

The invention provides a method of fabricating a semiconductor device by forming, on a P-type silicon substrate, a memory cell portion partitioned with a field oxide film, forming trenches in self-alignment with a polycrystalline silicon film which act as gate electrodes in the semiconductor device, completely burying second and third oxide films in the trenches, removing the third oxide film near the end of the field oxide film by using a second resist film as a mask and thereafter etching-back the whole surface to cause the second and third oxide films to remain only in the trenches. According to the method, the oxide film can be stably buried in the trenches.

10 Claims, 6 Drawing Sheets

METHOD OF FABRICATING AN BPSG-FILLED TREND AND OXIDATION ISOLATION STRUCTURE WITH A GATE ELECTRODE

BACKGROUND OF THE INVENTION

1. Field of the Invention

This invention relates to a method of fabricating a semiconductor device and in more particular to a method of fabricating a very fine and submicron trench isolation region.

2. Description of the Related Art

A method of fabricating conventional trench isolation regions will be described with reference to FIGS. 1A to 1F.

First, as shown in FIG. 1A, a field oxide film 2 is formed by selectively oxidizing the top surface of a P-type silicon substrate 1. Then a gate oxide film 3 is formed on the surface of the silicon substrate 1 at a prescribed position which will act at least as a memory cell in a semiconductor device. Consecutively, the whole surface of the semiconductor substrate including the field and gate oxide films 2 and 3 is covered with a polycrystalline silicon film 4 and a first oxide film 5 in order. Thereafter, as shown in FIG. 1B, a first resist film 6 is formed on the first oxide film 5, holes are made in prescribed positions of the resist film 6 corresponding to places which will act finally as trench isolation regions 7-1 to 7-3, and the first oxide film 5, the polycrystalline silicon film 4 and further the gate oxide film 3 are successively etched by using the first resist film 6 as a mask to cause the P-type silicon substrate 1 to be exposed. After the first resist film 6 is removed, as shown in FIG. 1C, the exposed silicon substrate is subjected to etching by using the first oxide film 5 as a mask to form trenches 8. Then, as shown in FIG. 1D, a second oxide film 9 and a third oxide film 10 are formed in order on the first oxide film 5 and the inner surfaces of the trenches 8 so that the oxide films 9 and 10 are completely buried in the trenches 8. In FIG. 1D, $d_1$, $d_2$ and $d_3$ are defined to represent the final thickness of the third oxide film 10 at prescribed positions shown in the drawing, i.e. at any position above the gate oxide film 3, any position above a boundary between the gate oxide film 3 and the field oxide film 2 and any position above the field oxide film 2, respectively. Then, as shown in FIG. 1E, the third oxide film 10, the second oxide film 9 and the first oxide film 5 are subjected to etch back by using the polycrystalline silicon film 4 as a stopper so that the second oxide film 9 and the third oxide film 10 are selectively buried only in the trench isolation regions 7-1 to 7-3. Finally, as shown in FIG. 1F, a silicide film is deposited on the whole surface above the semiconductor substrate, which is followed by selectively removing the silicide film to thus form a silicide wiring 11. Consequently, transistors 12 having polycide gate electrodes formed in self-alignment with the trench isolation regions 7-1 to 7-3 are formed. The polycide gate electrode is of a stacking structure comprising the polycrystalline silicon film and the silicide film.

Generally, as for the third oxide film 10, there is used a BPSG film formed by a low pressure CVD method and having good coverage and high reflow property. However, after heat-treating, the thickness of the third oxide film 10 has the following relation: $d_2 > d_3 \approx d_1$ as shown in FIG. 1D. Thus the first oxide film easily remains at the position of $d_2$ when the etch back is performed according to the conventional method, and over-etching must be performed to remove the remaining oxide film. When the over-etching is performed, the second and third oxide films buried in the trench are depressed and there is a possibility of a short circuit taking place between the silicide wiring and the silicon substrate. In addition, if an atmospheric pressure CVD method is used, the thickness of the third oxide film 10 has the following relation: $d_2 > d_3 >> d_1$, and thus the possible short circuit is more remarkable. A problem exists in that it is difficult to appropriately control the etch back step of burying the oxide films in the trenches according to the conventional method.

SUMMARY OF THE INVENTION

It is an object of this invention to provide a method of fabricating a semiconductor device in which oxide films are stably buried in very fine trenches for forming trench isolation regions.

The above object of the invention is accomplished by providing a method of fabricating a semiconductor device comprising the steps of: forming a polycrystalline silicon film and a first insulating film in order on a whole surface of a semiconductor substrate through a gate insulating film, the surface of the semiconductor substrate being provided with a portion acting as an active region in the semiconductor device and an element isolation region formed by selective oxidation which are partitioned each other; selectively etching the first insulating film, polycrystalline silicon film and gate insulating film corresponding to any portions within the active region which act as trench isolation regions in the semiconductor device and thereafter etching the semiconductor substrate in self-alignment with the first insulating film, to form the trench isolation regions; covering a whole surface of the semiconductor substrate including a surface of the first oxide film and inner surfaces of the trench isolation regions with a second insulating film and successively burying a third insulating film having faster dry etch rate than that of the second insulating film in the trench isolation region; covering the active region exclusive of a boundary between the active region and the element isolation region with a resist film; dry etching-back a region exclusive of the active region covered with the resist film by using the resist film as a mask and the polycrystalline film as a stopper at least till a thickness of the third insulating film of the region exclusive of the active region covered with the resist film is thinner than that of the third insulating film of the active region covered with the resist film; removing the resist film and dry etching-back a whole of the semiconductor substrate by using the polycrystalline silicon film as a stopper to cause the second and third insulating films to remain in the trench isolation regions; depositing an electrically conductive film on a whole surface of the resulting structure; and selectively removing the electrically conductive film and the polycrystalline silicon film to form gate electrodes.

DETAILED DESCRIPTION OF THE PREFERRED EMBODIMENTS

Next this invention will be described in more detail with reference to drawings.

FIGS. 2A to 2G show a series of partially and schematically cross-sectional views for explaining processes of a first embodiment of a method of fabricating a semiconductor device according to this invention.

Figure 1A:
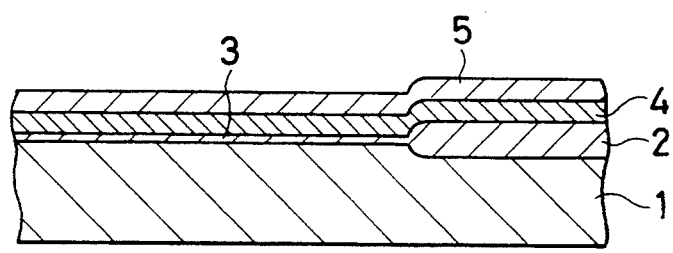
FIGS. 1A to 1F are a series of partially and schematically cross-sectional views for explaining processes of a method of fabricating trench isolation regions in a conventional semiconductor device.
Figure 1B:
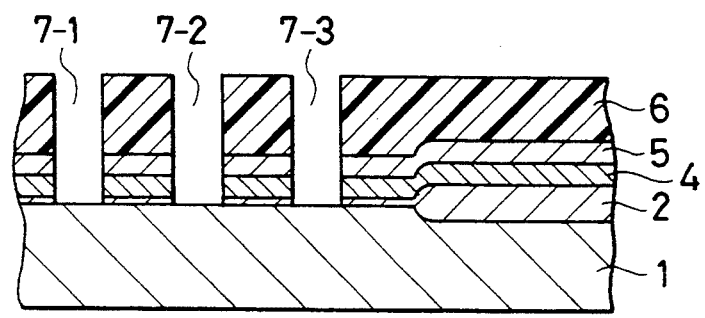
Figure 1C:
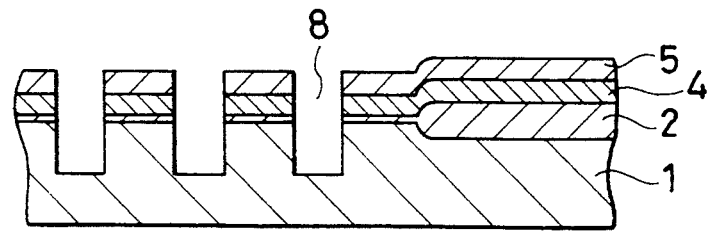
Figure 1D:
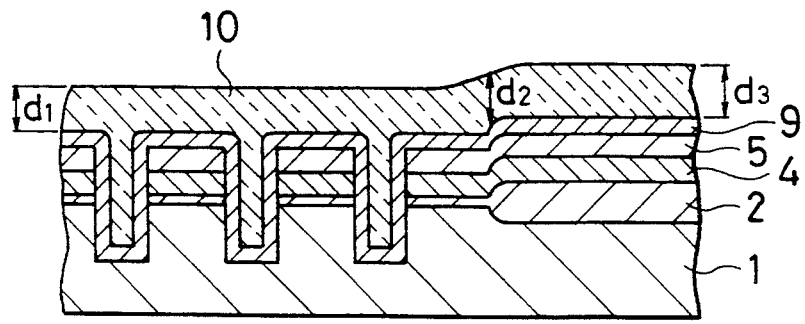
Figure 1E:
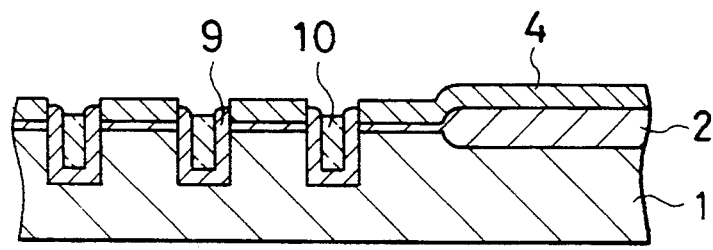
Figure 1F:
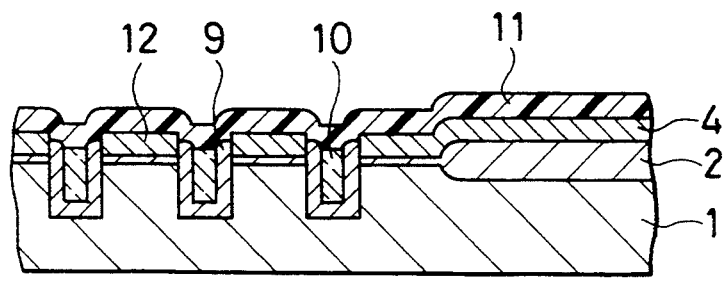
Figure 2A:
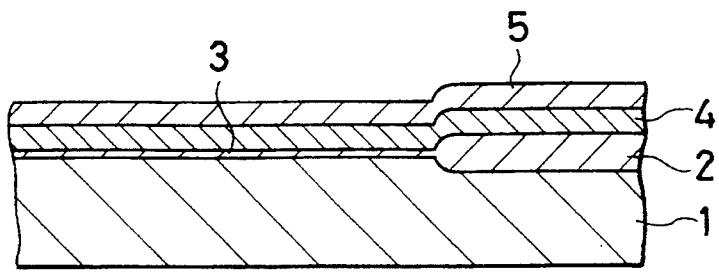
FIGS. 2A to 2G are a series of partially and schematically cross-sectional views for explaining processes of a first embodiment of a method of fabricating a semiconductor device according to this invention.
Figure 2B:
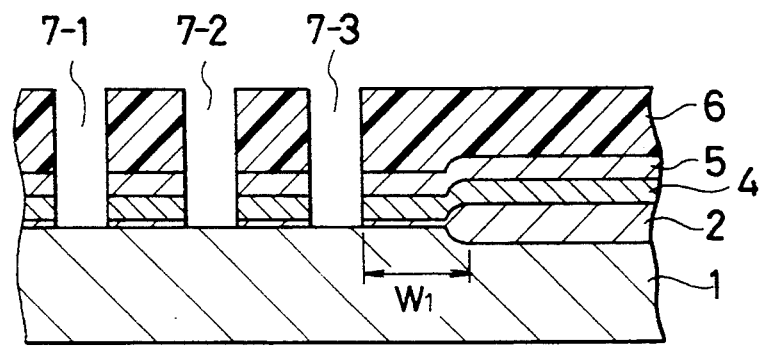
Figure 2C:
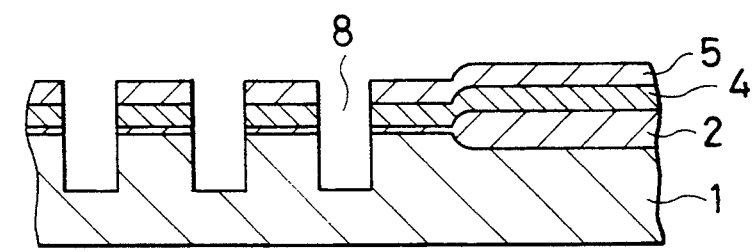
Figure 2D:
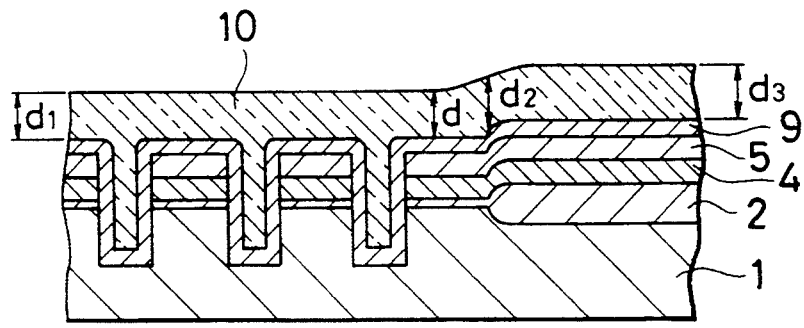

First, as shown in FIG. 2A, the top surface of a P-type silicon substrate 1 is selectively oxidized to form a field oxide film 2 having a film thickness of about 480 to about 600 nm at a prescribed position. Then a gate oxide film 3 from about 10 to about 30 nm thick is formed on the surface of the semiconductor substrate at a prescribed position which acts as an active region, for instance, at least as a memory cell in the semiconductor device. Thereafter, the whole surface of the semiconductor substrate including top surfaces of the field oxide film 2 and the gate oxide film 3 is covered with a polycrystalline silicon film 4 from about 100 to about 250 nm thick and a first oxide film 5 from about 100 to about 300 nm thick in order. Then, as shown in FIG. 2B, a first resist (for instance, photoresist, electron beam resist or the like) film 6 is formed on the first oxide film 5, and holes having a width of from about 0.3 to about 0.6 $\mu$m are made in prescribed positions of the resist film 6, i.e. only in the positions corresponding to positions which will act finally as trench isolation regions 7-1 to 7-3 in the semiconductor device. In the case, it is important to take the distance $W_1$ not less than 1 $\mu$m between the trench isolation region 7-3 and an end of the field oxide film 2. Then the first oxide film 5, the polycrystalline silicon film 4 and further the gate oxide film 3 are subjected to anisotropic etching in order by using the first resist film 6 as a mask to cause the P-type silicon substrate 1 to be exposed. It is necessary that etched shape of the polycrystalline silicon film 4 is vertical or slightly backward-tapered. Because, if the etched shape is forward-tapered, etch residue of the polycrystalline silicon film 4 takes place when silicide wirings 11 are formed and a short circuit between the silicide wirings is caused. Then, as shown in FIG. 2C, the first resist film 6 is removed and thereafter the P-type silicon substrate 1 is etched by using the first oxide film 5 as a mask to form trenches 8 having a depth of about 0.3 to about 1.5 $\mu$m. Then, as shown in FIG. 2D, the whole surface of the semiconductor substrate including the first oxide film 5 and the inner faces of the trenches 8 is covered with a second oxide film 9 having slower dry etch rate than that of a third oxide film 10, for instance, with a non-doped oxide film formed by a low pressure CVD method and having a thickness of about 100 to about 200 nm, and thereafter the third oxide film 10, for instance, a BPSG film formed by the low pressure CVD method is deposited thereon with a thickness of about 0.5 to about 1.5 m so that it is completely buried in the trenches 8. The BPSG film is subjected to reflow due to heat treatment at temperatures ranging from about 850° to about 950° C. so that the oxide film is completely buried in the trenches 8 with the flat surface. Practically, there is the variation in the film thickness as represented by the following formula: $d_2 > d_1 \approx d_3 \approx d$ (if the BPSG film 1 $\mu$m thick is deposited and is subjected to reflow, $d_2 - d_1 \approx 0.2 - 0.3$ $\mu$m). In the above-mentioned formula, $d_1$, $d_2$ and $d_3$ are as defined in FIG. 1D, and the thickness d is defined to represent a thickness of the third oxide film 10 at the position shown in FIG. 2D, i.e. at any position above the gate oxide film 3 falling within the distance $W_1$. Also, if a BPSG film formed by an atmospheric pressure CVD method is used for the third oxide film, the variation in the film thickness is more remarkable. If the trenches having an aspect ratio of 2 (opening: 0.6 $\mu$m, depth: 1.2 $\mu$m) are formed and the BPSG film 0.7 $\mu$m thick is deposited, the relation of the $d_1$, $d_2$ and $d_3$ is as follows: $d_2$ (0.8 $\mu$m) $> d_3$ (0.7 $\mu$m) $> d_1$ (0.6 $\mu$m).

Figure 2E:
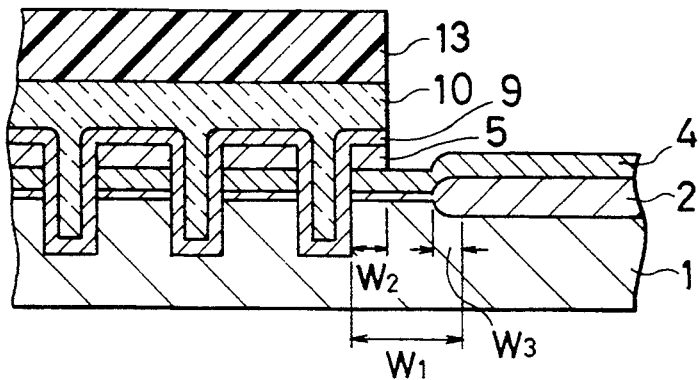

In order to absorb the variation in the film thickness as mentioned above, the memory cell region is covered with a second resist (for instance, photoresist, electron beam resist or the like) film 13 as shown in FIG. 2E and the third, second and first oxide films are subjected to dry etch back by using the polycrystalline silicon film 4 as a stopper to thereby completely expose the polycrystalline silicon film 4 of the portion free of the second resist film 13. It is appropriate that, if a length of a bird's beak portion of the field oxide film 2 is set to $W_3$, margin $W_2$ of the second resist film 13 for the trench isolation region 7-3 satisfies the following equation (1):

In any position shown by $(d-d_1)<0.1$ $\mu$m,
$(W_1-W_3)>W_2>$(two times stepper mask alignment accuracy)     (1)

Figure 2F:
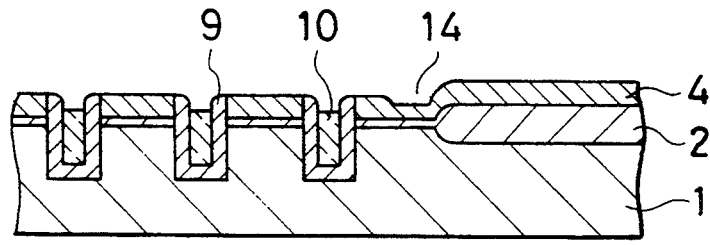

Then, as shown in FIG. 2F, after the second resist film 13 is removed, the whole surface is subjected to dry etch back by using the polycrystalline silicon film 4 as a stopper. Since proper over-etching is needed at this time, exposure of the P-type silicon substrate 1 at the sides of each trench is practically prevented by the second oxide film 9 having slower dry etch rate than that of the third oxide film 10. In addition, the second oxide film 9 has also the effect that out-diffusion of boron and phosphorus into the P-type silicon substrate 1 is suppressed during fellow of the third oxide film 10.

Incidentally, for the dry etch back conditions, etch selectivity of the first, second and third oxide films 5, 9 and 10 to the polycrystalline silicon film 4 is selected to range from 40 to 70. However, in the dry etching-back process shown in FIG. 2F, difference 14 in level (50 to 100 nm) arises from further etching of the polycrystalline silicon film 4 which has been already exposed at the preceding dry etching-back process in FIG. 2E.

If the above-mentioned margin $W_2$ is set so that it can be observed by a light microscope, it is useful for detection of the end point of etch back.

Figure 2G:
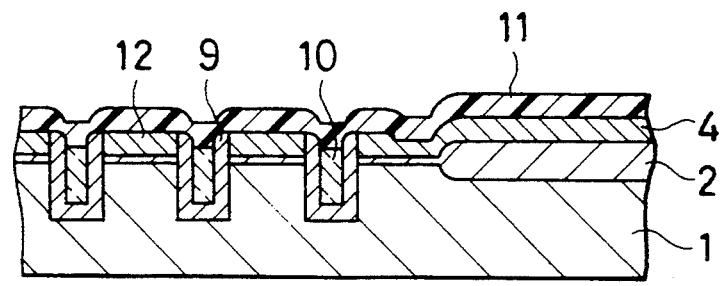

Then, as shown in FIG. 2G, a silicide film having a thickness ranging from about 100 to about 150 nm is deposited on the whole surface of the resulting structure, and the silicide film and the polycrystalline silicon film 4 are subjected to continuous etching, whereby a silicide wiring 11 is selectively formed and thus it is possible to obtain transistors 12 with polycide gate electrodes formed in self-alignment with the trench isolation regions 7-1 to 7-3.

Figure 3A:
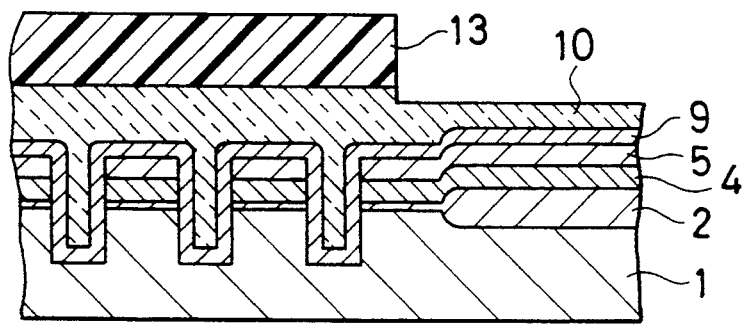
FIGS. 3A to 3C are a series of partially and schematically cross-sectional views for explaining processes of a second embodiment of a method of fabricating a semiconductor device according to this invention.
Figure 3B:
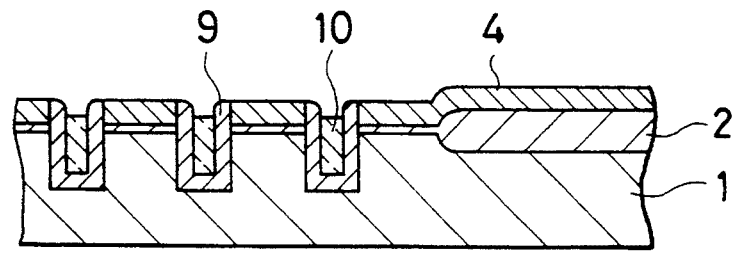
Figure 3C:
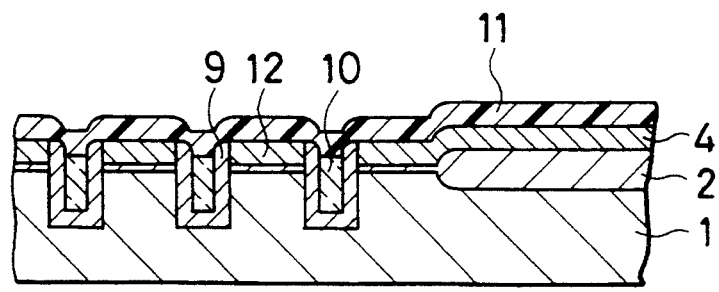

Referring now to FIGS. 3A to 3C which show a series of partially and schematically cross-sectional views for explaining processes of a second embodiment of the method of fabricating a semiconductor device according to this invention, it is appreciated that this embodiment has another effect in addition to that of the first embodiment. Namely, this embodiment has the effect of reduction in the difference 14 in level shown in FIG. 2F. All the parts and/or elements which are identical to those depicted in FIGS. 2A to 2G bear the same reference numerals.

Processes up to the process shown in FIG. 3A are identical to the processes shown in FIGS. 2A to 2D and details thereof are thus omitted for simplicity. As shown in FIG. 3A, the memory cell region is covered with the second resist film 13 and the third oxide film 10 which is not covered with the resist film 13 is subjected to dry etch back by using the resist film 13 as a mask. An amount of the third oxide film 10 to be dry etched-back corresponds to at least the amount of variation in the film thickness of the third oxide film 10 as mentioned above. For this reason, an etching time for the polycrystalline silicon film 4 decreases when the whole surface is subjected to the dry etch back as shown in FIG. 3B and thus the difference 14 in level is reduced to values ranging from about 1 to about 15 nm. Then the process shown in FIG. 3C is performed in the same manner as in FIG. 2G.

Figure 4A:
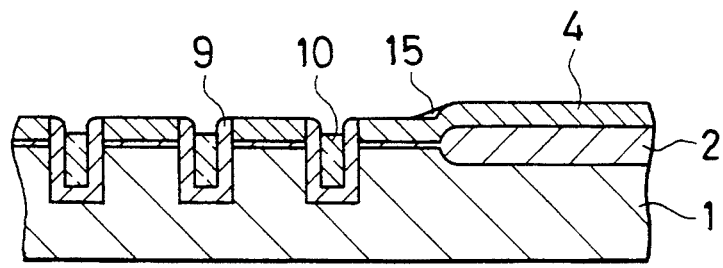
FIGS. 4A to 4C are a series of partially and schematically cross-sectional views for explaining processes of a third embodiment of a method of fabricating a semiconductor device according to this invention.
Figure 4B:
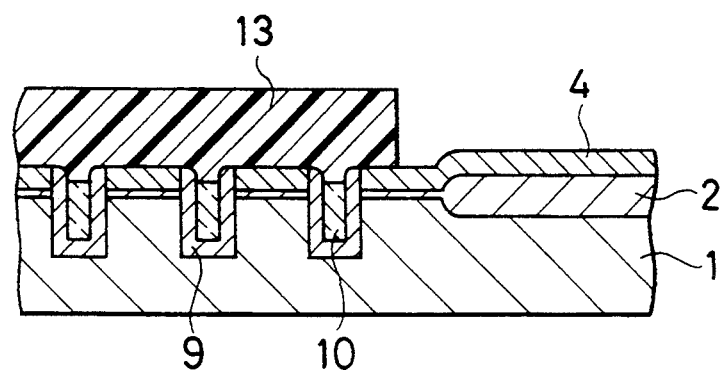
Figure 4C:
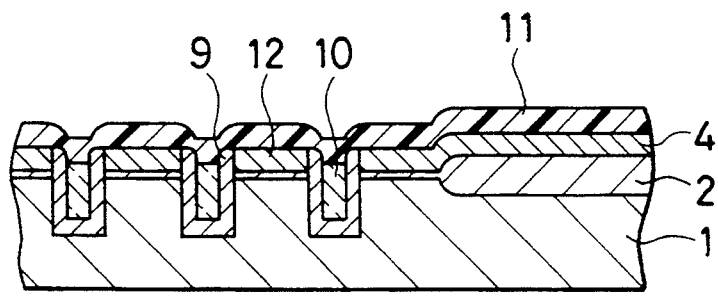

Referring now to FIGS. 4A to 4C which show a series of partially and schematically cross-sectional views for explaining processes of a third embodiment of the method of fabricating a semiconductor device according to this invention, it is appreciated that this embodiment has even another effect in addition to that of the second embodiment. Namely, this embodiment has the effect that the difference 14 in level shown in FIG. 2F does not quite arise. All the parts and/or elements which are identical to those depicted in FIGS. 2A to 2G bear the same reference numerals.

Processes up to the process shown in FIG. 4A are identical to the processes shown in FIGS. 2A to 2D and details thereof are thus omitted for simplicity. As shown in FIG. 4A, the third, second and first oxide films 10, 9 and 5 are subjected to the dry etch back. An amount of the third and second oxide films 10 and 9 to be dry etched-back is controlled to be enough amount to bury the second oxide film 9 and the third oxide films 10 in the trenches 8. In this process, however, residue 15 of the the oxide film 5 occurs on the polycrystalline silicon film 4 at the position corresponding to the edge of the field oxide film 2 due to the variation in the film thickness of the third oxide film 10. So, after covering the memory cell region with the second resist film 13, the residue 15 of the oxide film is removed by using the second resist film 13 as a mask according to a wet-etching process with high selectivity of the oxide film to the polycrystalline silicon film 4 as shown in FIG. 4B. For this reason, there is attained the effect that the difference 14 in level shown in FIG. 2F does not quite arise. Then the process shown in FIG. 4C is performed in the same manner as in FIG. 2G.

As discussed above, according to this invention, in order to prevent the variation in the film thickness after the heat treatment of the third oxide film, particularly in order to prevent the over-etching to the oxide film buried in the trenches when etching-back the whole surface, the over-etching being due to the edge of field oxide film, the etch back of the whole surface is performed after at least the amount of variation in the film thickness of the third oxide film is removed by using the resist film as a mask. Consequently, controllability in the etch back is improved and the oxide film is stably buried in the trenches. In addition, when the etch back is performed by using the second oxide film having slower dry etch rate than that of the third oxide film, it is possible to secure the margin for preventing exposure of the silicon substrate at the sides of each trench and thus short circuits between the silicide wirings and the substrate can be prevented.

While this invention has been particularly described with reference to the preferred embodiments thereof, it will be understood by those skilled in the art that the foregoing and other changes in form and details may be made therein without departing from the spirit and scope of the invention.

What is claimed is:

1. A method of fabricating a semiconductor device comprising the steps of:

forming a gate insulating film, a polycrystalline silicon film and a first insulating film sequentially on a semiconductor substrate providing a portion acting as an active region in the semiconductore substrate and partitioning said active region by an element isolation region formed by selective oxidation;

selectively etching said first insulating film, polycrystalline silicon film and gate insulating film corresponding to any portions within said active region which act as trench isolation regions in said semiconductor device and thereafter etching said semiconductor substrate in self-alignment with said first insulating film, to form said trench isolation regions;

covering the resulting structure with a second insulating film and successively burying a third insulating film having a faster dry etch rate than that of said second insulating film;

covering said active region exclusive of a boundary between said active region and said element isolation region with a resist film;

dry etching-back a region exclusive of said active region covered with said resist film by using said resist film as a mask and said polycrystalline film as a stopper at least until a thickness of said third insulating film of said region exclusive of said active region covered with said resist film is thinner than that of said third insulating film of said active region covered with said resist film;

removing said resist film and dry etching-back the resulting structure by using said polycrystalline silicon film as a stopper to cause said second and third insulating films to remain in said trench isolation regions;

depositing an electrically conductive film on the surface of the resulting structure; and selectively removing said electrically conductive film and said polycrystalline silicon film to form gate electrodes.

2. The method of fabricating a semiconductor device as defined in claim 1, wherein the step of dry etching-back said region exclusive of said active region covered with said resist film by using the said resist film as a mask and said polycrystalline silicon film as a stopper is performed until said polycrystalline silicon film of said region exclusive of said active region covered with said resist film is completely exposed.

3. The method of fabricating a semiconductor device as defined in claim 1, wherein the step of dry etching-back said region exclusive of said active region covered with said resist film by using the said resist film as a mask is performed until an amount of said third insulating film of said region exclusive of said active region covered with said resist film to be dry etched-back is at least an amount of variation in a thickness of said third insulating film.

4. The method of fabricating a semiconductor device as defined in claim 1, wherein said resist film is a photoresist film.

5. The method of fabricating a semiconductor device as defined in claim 1, wherein distance between an end of said element isolation region formed by selective oxidation and said trench isolation region nearest to said element isolation region is not less than 1 $\mu$m.

6. The method of fabricating a semiconductor device as defined in claim 1, wherein in the step of selectively etching said first insulating film, polycrystalline film and gate insulating film, etches said polycrystalline silicon film vertically or slightly backward-tapered.

7. A method of fabricating a semiconductor device comprising the steps of:

forming a gate insulating film, a polycrystalline silicon film and a first insulating film sequentially on a semiconductor substrate;

providing a portion acting as an active region in said semiconductor substrate and partitioning said active region by an element isolation region formed by selective oxidation;

selectively etching said first insulating film, polycrystalline silicon film and gate insulating film corresponding to any portions within said active region which act as trench isolation regions in said semiconductor device and thereafter etching said semiconductor substrate in self-alignment with said first insulating film, to form said trench isolation regions;

covering the resulting structure with a second insulating film and successively burying a third insulating film having faster dry etch rate than that of said second insulating film;

dry etching-back the resulting structure by using said polycrystalline silicon film as a stopper to cause said second and third insulating films to remain at least in said trench isolation regions;

covering said active region exclusive of a boundary between said active region and said element isolation region with a resist film;

completely removing said first insulating film by using said resist film as a mask;

depositing an electrically conductive film on the surface of the resulting structure; and selectively removing said electrically conductive film and said polycrystalline silicon film to form gate electrodes.

8. The method of fabricating a semiconductor device as defined in claim 7, wherein said resist film is a photoresist film.

9. The method of fabricating a semiconductor device as defined in claim 7, wherein distance between an end of said element isolation region formed by selective oxidation and said trench isolation region nearest to said element isolation region is not less than 1 $\mu$m.

10. The method of fabricating a semiconductor device as defined in claim 7, wherein in the step of selectively etching said first insulating film, polycrystalline film and gate insulating film, etches said polycrystalline silicon film vertically or slightly backward-tapered.

* * * * *

UNITED STATES PATENT AND TRADEMARK OFFICE
CERTIFICATE OF CORRECTION

PATENT NO. : 5,362,668

DATED : November 8, 1994

INVENTOR(S) : TASAKA

It is certified that error appears in the above-identified patent and that said Letters Patent is hereby corrected as shown below:

Col. 3, line 67, delete "m" and insert --µm--.

Col. 6, line 25, delete "semiconductore" and insert --semiconductor--.

Signed and Sealed this

Fourteenth Day of February, 1995

Attest:

BRUCE LEHMAN

Attesting Officer     Commissioner of Patents and Trademarks